United States Patent
Fabregas et al.

(10) Patent No.: US 10,326,442 B2
(45) Date of Patent: Jun. 18, 2019

(54) ASSEMBLY HAVING INTERNALLY CONFIGURABLE SOLID-STATE SWITCH ARRANGEMENT FOR USE AS ONE OR MORE DISCONNECTION SWITCHES IN ELECTRICAL SYSTEMS AND HAVING EXTERNAL PACKAGE COMMON TO THE ELECTRICAL SYSTEMS

(71) Applicant: Lear Corporation, Southfield, MI (US)

(72) Inventors: Antoni Ferre Fabregas, Valls (ES);
Federico Giordano, Valls (ES);
Alberto Aragones Carrete, Valls (ES);
Victor Poblet-Espolet, Valls (ES)

(73) Assignee: Lear Corporation, Southfield, MI (US)

( * ) Notice: Subject to any disclaimer, the term of this patent is extended or adjusted under 35 U.S.C. 154(b) by 342 days.

(21) Appl. No.: 14/982,154

(22) Filed: Dec. 29, 2015

(65) Prior Publication Data
US 2017/0187371 A1    Jun. 29, 2017

(51) Int. Cl.
*H02J 9/00* (2006.01)
*H03K 17/687* (2006.01)
(Continued)

(52) U.S. Cl.
CPC ............ *H03K 17/687* (2013.01); *H02H 9/02* (2013.01); *H02J 7/0068* (2013.01); *H03K 17/082* (2013.01)

(58) Field of Classification Search
USPC ........................................................ 307/66
See application file for complete search history.

(56) References Cited

U.S. PATENT DOCUMENTS

| 4,811,163 A | * | 3/1989 | Fletcher | ................. | H01H 9/542 |
| | | | | | 307/141.8 |
| 6,157,089 A | | 12/2000 | Xu | | |

(Continued)

FOREIGN PATENT DOCUMENTS

| CN | 101888177 A | 11/2010 |
| CN | 104037929 A | 9/2014 |
| WO | 2013054688 A1 | 4/2013 |

OTHER PUBLICATIONS

Eberspacher 1 Automotive Controls, Centralized Board grid stabilization, http://translate.googleusercontent.com/translate_c?depth=1&hl=e, Jun. 18, 2015.

(Continued)

*Primary Examiner* — Rexford N Barnie
*Assistant Examiner* — Dru Parries
(74) *Attorney, Agent, or Firm* — Brooks Kushman P.C.

(57) ABSTRACT

An assembly for providing one or two disconnection switches in any of different electrical supply systems includes a printed circuit board having an internally configurable dual switch arrangement. The dual switch arrangement includes first and second switch areas for first and second groups of solid-state devices, first and second driver areas for first and second switch drivers, and busbars and power terminals. The first switch area includes the first group of solid-state devices and the first driver area includes the first switch driver which drives these solid-state devices as either a normally closed (NC) or a normally opened (NO) disconnection switch. First and second ones of the busbars respectively connect ends of the disconnection switch to first and second ones of the power terminals whereby the disconnection switch is provided in the electrical supply system when the electrical supply system is connected to the first and second power terminals.

9 Claims, 4 Drawing Sheets

(51) Int. Cl.
*H02J 7/00* (2006.01)
*H02H 9/02* (2006.01)
*H03K 17/082* (2006.01)

(56) References Cited

U.S. PATENT DOCUMENTS

| | | |
|---|---|---|
| 7,460,344 B2 | 12/2008 | Hastings et al. |
| 8,760,002 B2 | 6/2014 | Lim |
| 2012/0251866 A1 | 10/2012 | Matejek et al. |

OTHER PUBLICATIONS

Eberspacher II, Control unit innovation by Eberspacher Controls regulates new Mercedes Benz SLK roof glazing, Esslingen/Herxheim, http://archiv.iaa.de/2011/index.php?id=1471&L=1&tx_ttnews% . . . , Sep. 2011.

China National Intellectual Property Administration, First Office Action for the counterpart Chinese Patent Application No. 201611117524.4 dated Jan. 25, 2019.

\* cited by examiner

FIG. 7

ASSEMBLY HAVING INTERNALLY CONFIGURABLE SOLID-STATE SWITCH ARRANGEMENT FOR USE AS ONE OR MORE DISCONNECTION SWITCHES IN ELECTRICAL SYSTEMS AND HAVING EXTERNAL PACKAGE COMMON TO THE ELECTRICAL SYSTEMS

TECHNICAL FIELD

The present disclosure relates to electrical disconnection assemblies and systems containing such assemblies.

BACKGROUND

Electrical disconnection systems include one or more disconnection switches. A disconnection switch (e.g., a relay) selectively connects or disconnects electrical devices to/from one another. For instance, a disconnection switch selectively connects or disconnects a battery and a load. Disconnection systems are used in an assortment of vehicles including vehicles powered by an internal combustion engine and having a stop-start system, vehicles having multiple batteries, and hybrid vehicles. Depending on requirements, the disconnection systems may employ a normally closed ("NC") disconnection switch, a normally opened ("NO") disconnection switch, or both of a NC disconnection switch and a NO disconnection switch. In some cases, measurement of disconnection switch voltage and switch current is to be taken.

SUMMARY

An assembly for providing an electrical disconnection system including one or two disconnection switches in any of a plurality of different electrical supply systems is provided. The assembly includes a printed circuit board (PCB) having an internally configurable dual switch arrangement including first and second switch areas for first and second groups of solid-state devices to be respectively mounted thereon, first and second driver areas for first and second switch drivers to be respectively mounted thereon, first and second busbars, and first, second, and third power terminals externally accessible to connectors of an electrical supply system. The first switch area includes the first group of solid-state devices mounted thereon and the first driver area includes the first switch driver mounted thereon. The first switch driver is configured to drive the first group of solid-state devices as a first disconnection switch in a form of one of a normally closed (NC) disconnection switch and a normally opened (NO) disconnection switch. The first busbar connects one end of the first disconnection switch to the first power terminal and the second busbar connects another end of the first disconnection switch to the second power terminal whereby a closed circuit including an electrical supply system having the first disconnection switch is formed by connectors of the electrical supply system being respectively connected to the first and second power terminals.

In an embodiment, the internally configurable dual switch arrangement further includes a third busbar. The second switch area includes the second group of solid-state devices mounted thereon and the second driver area includes the second switch driver mounted thereon. The second switch driver is configured to drive the second group of solid-state devices as a second disconnection switch in a form of the other one of a NC disconnection switch and a NO disconnection switch. The second busbar connects one end of the second disconnection switch to the second power terminal and the third busbar connects another end of the second disconnection switch to the third power terminal whereby a closed circuit including the electrical supply system having the second disconnection switch is formed by connectors of the electrical supply system being respectively connected to the second and third power terminals.

In an embodiment, the first disconnection switch is a NC disconnection switch and the second disconnection switch is a NO disconnection switch. In this case, the first and second groups of solid-state devices may be N-channel MOSFETs. Alternatively, the first group of solid-state devices are P-channel MOSFETs and the second group of solid-state devices are N-channel MOSFETs.

In an embodiment, the first disconnection switch is a NO disconnection switch and the second disconnection switch is a NC disconnection switch. In this case, the first group of solid-state devices are N-channel MOSFETs and the second group of solid-state devices are N-channel MOSFETs. Alternatively, first group of solid-state devices are N-channel MOSFETs and the second group of solid-state devices are P-channel MOSFETs.

An electrical supply system for supplying energy from a battery to a load is provided. The system includes an assembly having an internally configurable dual switch arrangement including a PCB having first and second switch areas for first and second groups of solid-state devices to be respectively mounted thereon, first and second driver areas for first and second switch drivers to be respectively mounted thereon, first and second busbars, and first, second, and third power externally accessible terminals. The first switch area includes the first group of solid-state devices mounted thereon and the first driver area includes the first switch driver mounted thereon. The first switch driver is configured to drive the first group of solid-state devices as a first disconnection switch in a form of one of a normally closed (NC) disconnection switch and a normally opened (NO) disconnection switch. The first busbar connects one end of the first disconnection switch to the first power terminal and the second busbar connects another end of the first disconnection switch to the second power terminal. The system further includes a first connector which connects the battery to the first power terminal and a second connector which connects the load to the second power terminal such that the battery is connected to the load through the first disconnection switch.

In an embodiment, the internally configurable dual switch arrangement further includes a third busbar. The second switch area includes the second group of solid-state devices mounted thereon and the second driver area includes the second switch driver mounted thereon. The second switch driver is configured to drive the second group of solid-state devices as a second disconnection switch in a form of the other one of a NC disconnection switch and a NO disconnection switch. The second busbar connects one end of the second disconnection switch to the second power terminal and the third busbar connects another end of the second disconnection switch to the third power terminal. In this embodiment, the system further includes a third connector which connects a second battery to the third power terminal such that the second battery is connected to the load through the second disconnection switch.

In an embodiment, a method for providing an electrical disconnection system including one or two disconnection switches for use in any of different electrical supply systems includes assembling a PCB to include first and second switch areas, first and second driver areas, first and second busbars, and first, second, and third power terminals and providing the PCB within a housing with the first, second and third power terminals being accessible outside of the housing. The method further includes, upon an electrical disconnection system including one disconnection switch to be used in an electrical supply system, populating one of the switch areas with a group of solid-state devices and one of the driver areas with a switch driver configured to drive the group of solid-state devices as a disconnection switch in a form of one of a NC disconnection switch and a NO disconnection switch, connecting one of the busbars between one end of the disconnection switch and one of the power terminals, and connecting another one of the busbars between another end of the disconnection switch and another one of the power terminals whereby a closed circuit including the electrical supply system having the disconnection switch is formed when connectors of the electrical supply system are respectively connected to the power terminals connected to the disconnection switch via busbars.

In an embodiment, the one of the switch areas populated with the group of solid-state devices is the first switch area, the one of the driver areas populated with the switch driver is the first driver area, the one of the busbars is the first busbar, the other one of the busbars is the second busbar, the one of the power terminals is the first power terminal, and the other one of the power terminals is the second power terminal. In this embodiment, the method may further include assembling the PCB to further include a third busbar and, upon the electrical disconnection system including two disconnection switches to be used in the electrical supply system, populating the second switch area with a second group of solid-state devices and the second driver area with a second switch driver configured to drive the second group of solid-state devices as a second disconnection switch in a form of the other one of a NC disconnection switch and a NO disconnection switch, connecting the second busbar between one end of the second disconnection switch and the second power terminal, and connecting the third busbar between another end of the second disconnection switch and the third power terminal whereby a closed circuit including the electrical supply system having the second disconnection switch is formed when connectors of the electrical supply system are respectively connected to the second and third power terminals.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
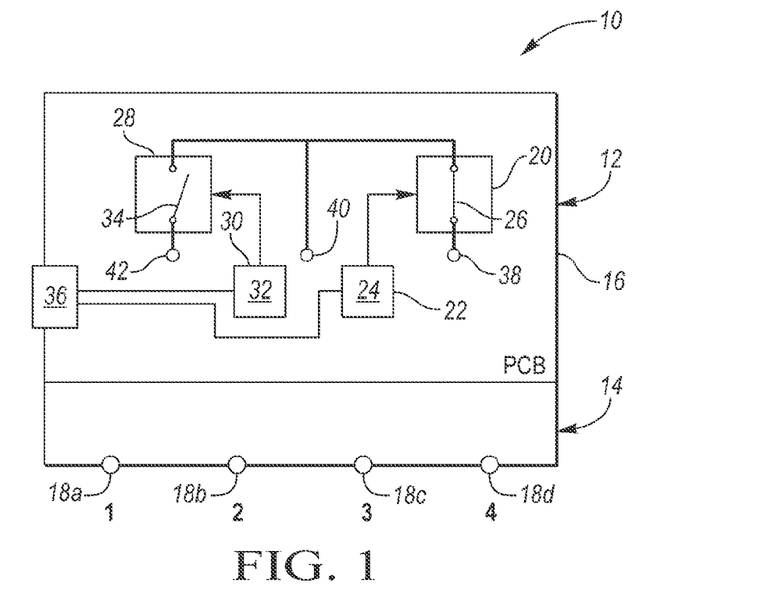
FIG. 1 illustrates a block diagram of an assembly having an internally configurable dual switch arrangement for use as one or two disconnection switches in electrical supply systems and having an external package common to the electrical supply systems.

Referring now to FIG. 1, a block diagram of an assembly 10 having an internally configurable dual switch arrangement 12 for use as one or two disconnection switches in electrical supply systems and having an external package 14 common to the electrical supply systems is shown.

A disconnection switch may be a normally closed ("NC") disconnection switch or a normally opened ("NO") disconnection switch. In this regard, an electric circuit including a disconnection switch can be a closed circuit where the electrical power flows or an opened circuit where the electrical power flow does not flow. In the case of the disconnection switch being a NC disconnection switch, the switch enables electrical power flow until the switch is activated (i.e., opened) and thereby prevents electrical power flow. Alternately, in the case of the disconnection switch being a NO disconnection switch, the switch prevents electrical power flow until the switch is activated (i.e., closed) and thereby enables electrical power flow.

An electrical supply system of a vehicle, such as a vehicle having a start and stop system, may have two batteries. The two batteries include a main battery for supplying electrical loads of the vehicle and a starter battery for starting the vehicle. For system protection, the possibility for one or both of the batteries to be disconnected from their respective loads is to be provided. As such, the electrical supply system further includes a disconnection switch for each battery that is to be able to be disconnected from its load.

Depending on the configuration of the electrical supply system, a NC disconnection switch, a NO disconnection switch, or both of a NC disconnection switch and a NO disconnection switch are provided in the electrical supply system. In some cases, current sensing of one of the batteries, such as the starter battery, is also to be provided. Therefore, it would be convenient to have a disconnection system in the form of a configurable electronic module which, having the same external package and connection terminals, may be used as the one or more disconnection switches in the different mentioned electrical supply system cases.

A disconnection switch may be implemented as an electromechanical relay or a solid-state relay. A disconnection switch implemented as an electromechanical relay is typically a NC disconnection switch. An electromechanical disconnection switch has almost null quiescent current, but has a relatively slow opening and closing time (e.g., >10 mSec). A disconnection switch implemented as a solid-state relay is typically a NO disconnection switch formed by N-channel MOSFETs. A solid-state disconnection switch has a relatively fast opening and closing time (e.g., <1 mSec), but also has some quiescent current (e.g., <100 µA). Therefore, in the case of an electrical supply system having one NC disconnection switch and one NO disconnection switch, it is not customary to have both disconnection switches implemented using solid-state technology. Instead, it is customary to implement the NC disconnection switch as an electromechanical switch and to implement the NO disconnection switch as a solid-state switch. In this case of a disconnection system having an electromechanical NC disconnection switch and a solid-state NO disconnection switch, it is unpractical and uneconomical for the disconnection system to have a common external package for the different mentioned electrical supply system cases.

Assembly 10 makes it practical and economical for an electrical disconnection system to have a common external package for the different mentioned electrical supply cases. In this regard, a feature of assembly 10 involves dual configurable solid-state switches for battery disconnection systems. Assembly 10 provides an electronic module having first and second groups of solid-state devices. The first group of solid-state devices forms a first disconnection switch and the second group of solid-state devices forms a second disconnection switch. The electronic module includes a first switch driver and a second switch driver for the first and second groups of solid-state devices, respectively. The first switch driver is operable to drive the first group of solid-state devices to operate as a NC disconnection switch. The second switch driver is operable to drive the second group of solid-state devices to operate as a NO disconnection switch. In this way, assembly 10 may be configured to function as a single NC disconnection switch, a single NO disconnection switch, or both of a NC disconnection switch and a NO disconnection switch. Further, irrespective of how assembly 10 is configured to function as any of the three different disconnection switch configurations, assembly 10 may be used in different electrical supply systems without any external change. The different electrical supply systems may include different automotive electrical supply systems such as those used in vehicles with stop and start functionality and hybrid vehicles.

In one version of assembly 10, each of the first and second groups of solid-state devices is a group of N-channel MOSFETs with the first group forming a NC disconnection switch and the second group forming a NO disconnection switch. In another version of assembly 10, the first group of solid-state devices is a group of P-channel MOSFETs forming a NC disconnection switch and the second group of solid-state devices is a group of N-channel MOSFETs forming a NO disconnection switch. The use of P-channel MOSFETs permits the implementation of a NC disconnection switch having relatively fast opening and closing times, but with some quiescent current. However, more P-channel MOSFETs would be provided than N-channel MOSFETs to produce the same amount of power. It is possible in another version that each of the first and second groups of solid-state devices is a group of P-channel MOSFETs.

The block diagram of assembly 10 shown in FIG. 1 is a high-level block diagram. As indicated, assembly 10 includes an internally configurable dual switch arrangement 12 and an external package 14. Dual switch arrangement 12 is configurable to function as a NC disconnection switch, a NO disconnection switch, or both of a NC disconnection switch and a NO disconnection switch in electrical supply systems. External package 14 presents a common external configuration to the electrical supply systems.

Assembly 10 includes a printed circuit board (PCB) 16 on which dual switch arrangement 12 is arranged. Assembly 10 further includes a set of power terminals 18a, 18b, 18c, and 18d which are part of external package 14. Power terminals 18a, 18b, 18c, and 18d are externally accessible for connection with corresponding contact points of electrical supply systems. For reference, power terminals 18a, 18b, 18c, and 18d are shown in the drawings with the labels "1", "2", "3", and "4", respectively.

PCB 16 includes a first designated switch area 20 for a first group of solid-state devices (e.g., MOSFETs) to be mounted thereon. PCB 16 further includes a first designated driver area 22 for a first switch driver 24 to be mounted thereon. First switch driver 24 is operable to drive the first group of solid-state devices to operate as a NC disconnection switch 26.

PCB 16 includes a second designated switch area 28 for a second group of solid-state devices (e.g., MOSFETs) to be mounted thereon. PCB 16 further includes a second designated driver area 30 for a second driver 32 to be mounted thereon. Second switch driver 32 is operable to drive the second group of solid-state devices to operate as a NO disconnection switch 34.

PCB 16 includes a control connector 36 mounted thereon. Control connector 36 is electrically connected with first and second designated driver areas 22 and 30 to be in communication with first and second drivers 24 and 32. Control connector 36 is also externally accessible for connection with a corresponding controller of electrical supply systems. In this way, control connector 36 is also part of external package 14.

PCB 16 includes a first switch terminal 38, a common switch terminal 40, and a second switch terminal 42 mounted thereon. First switch terminal 38 is electrically connected to one end of NC disconnection switch 26 and common switch terminal 40 is electrically connected to the other end of NC disconnection switch 26. Accordingly, an electrical supply system including a battery (e.g., a main battery or a starter battery), NC disconnection switch 26, and a load (e.g., electrical loads, DC/DC supply, alternator, or a starter) would be formed by connecting first switch terminal 38 to the battery and common switch terminal 40 to the load.

Second switch terminal 42 is electrically connected to one end of NO disconnection switch 34 and common switch terminal 40 is electrically connected to the other end of NO disconnection switch 34. Accordingly, an electrical supply system including a battery, NO disconnection switch 34, and a load would be formed by connecting second switch terminal 42 to the battery and common switch terminal 40 to the load.

As described, FIG. 1 shows a high-level block diagram of assembly 10 with NC disconnection switch 26, NO disconnection switch 34, corresponding switch drivers 24 and 32, and power terminals 18a, 18b, 18c, and 18d. By populating/depopulating the first and/or second groups of solid-state devices to form a NC disconnection switch 26 and/or a NO disconnection switch 34 and introducing appropriate busbars between the disconnection switches and power terminals 18a, 18b, 18c, and 18d, assembly 10 provides a disconnection system which, having the same external package 14, may be used as a NC disconnection switch, a NO disconnection switch, or both of a NC disconnection switch and a NO disconnection switch in electrical supply systems of different types.

That is, by combining first and/or second groups of solid-state devices with the corresponding drivers in a single PCB 16 and appropriate busbars for power distribution, it is possible to use assembly 10 in various electrical supply systems by population/depopulation of appropriate components and without any changes to PCB 16 itself or to external package 14.

Figure 2:
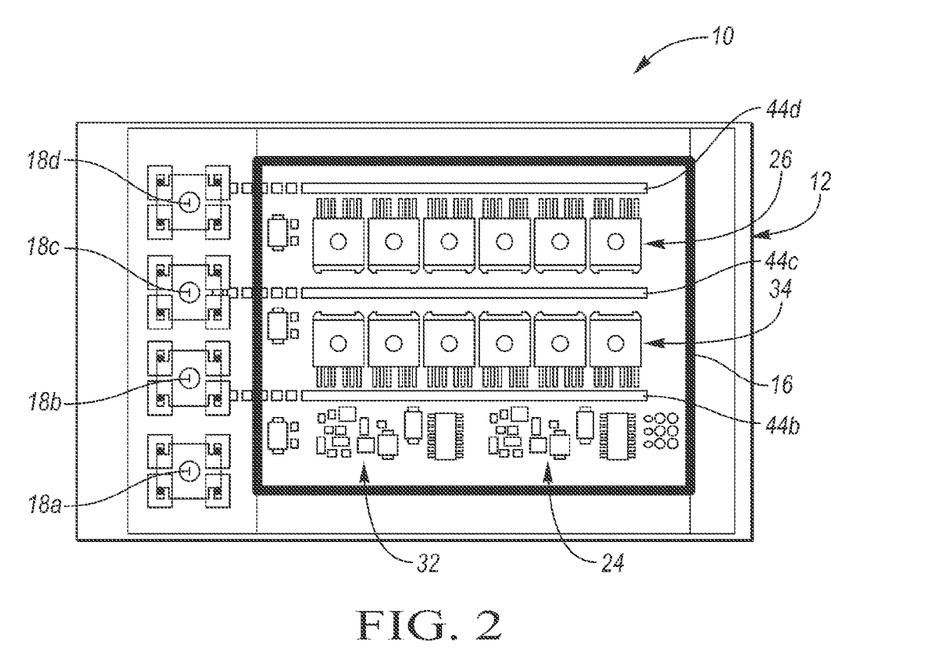
FIG. 2 illustrates a block diagram of a first possible layout of the components of the internally configurable dual switch arrangement of the assembly.

Referring now to FIG. 2, with continual reference to FIG. 1, a block diagram of a first possible layout of the components of internally configurable dual switch arrangement 12 of assembly 10 is shown. First and second groups of N-channel MOSFETs are in the first possible layout. When driven by respective switch drivers 24 and 32, the first and second groups of N-channel MOSFETs respectively form NC disconnection switch 26 and NO disconnection switch 34. In the first possible layout, PCB 16 includes first, second, and third busbars 44b, 44c, and 44d (mounted or not depending on the configuration). Power terminals 18a, 18b, 18c, and 18d are provided for all possible component layouts of internally configurable dual switch arrangement 12.

First busbar 44b is for electrically connecting second switch terminal 42, which is electrically connected to one end of NO disconnection switch 34, to power terminal 18b. Second busbar 44c is for electrically connecting common switch terminal 40, which is electrically connected to the other end of NO disconnection switch 34, to power terminal 18c. Accordingly, an electrical supply system including a battery, NO disconnection switch 34, and a load is formed by connecting the battery to power terminal 18b and the load to power terminal 18c when first and second busbars 44b and 44c are respectively mounted to power terminals 18b and 18c.

Second busbar 44c is further for electrically connecting common switch terminal 40, which is also electrically connected to one end of NC disconnection switch 26, to power terminal 18c. Third busbar 44d is for electrically connecting first switch terminal 38, which is electrically connected to the other end of NC disconnection switch 26, to power terminal 18d. Accordingly, an electrical supply system including a battery, NC disconnection switch 26, and a load is formed by connecting the battery to power terminal 18d and the load to power terminal 18c when second and third busbars 44c and 44d are respectively mounted to power terminals 18c and 18d.

Further, an electrical supply system including first and second batteries, NC disconnection switch 26, NO disconnection switch 34, and a load is formed by connecting the first battery to power terminal 18d, the second battery to power terminal 18b, and the load to power terminal 18c when first, second, and third busbars 44b, 44c, and 44d, which are respectively connected to terminals 42, 40, and 38, are respectively mounted to power terminals 18b, 18c, and 18d.

Referring now to FIGS. 3A, 3B, 4A, 4B, 5A, and 5B, with continual reference to FIGS. 1 and 2, different configurations of internally configurable dual switch arrangement 12 of assembly 10 for use as a disconnection system having a NC disconnection switch, a NO disconnection switch, or both of a NC disconnection switch and a NO disconnection switch in different electrical supply systems will be described. Assembly 10 has the same external package 14 irrespective of the configuration of internally configurable dual switch arrangement 12.

Figure 3A:
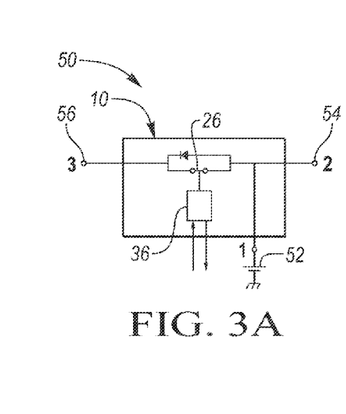
FIG. 3A illustrates an electrical schematic of a first electrical supply system having one battery and a normally closed ("NC") disconnection switch.

FIG. 3A illustrates an electrical schematic of a first electrical supply system 50 having a battery 52 and a NC disconnection switch 26. First electrical supply system 50 is for a vehicle having a starter 54 and an electrical load 56. Battery 52 (i.e., a direct current (DC) battery) is to supply electrical power to starter 54 and electrical load 56. Electrical load 56 includes, for instance, a DC/DC supply. As shown in FIG. 3A, NC disconnection switch 26 is closed.

Figure 3B:
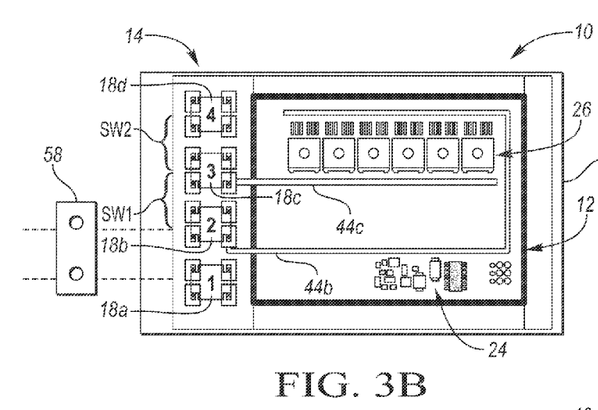
FIG. 3B illustrates a block diagram of the assembly in which the internally configurable dual switch arrangement of the assembly is configured to be the NC disconnection switch in the first electrical supply system.

FIG. 3B illustrates a block diagram of assembly 10 in which internally configurable dual switch arrangement 12 of the assembly is configured as a disconnection system having NC disconnection switch 26 in first electrical supply system 50. In this configuration, first busbar 44b is electrically connected to second power terminal 18b and one end of NC disconnection switch 26 and second busbar 44c is electrically connected to third power terminal 18c and the other end of NC disconnection switch 26.

Incorporating assembly 10 in first electrical supply system 50 for the assembly to provide NC disconnection switch 26 in the first electrical supply system includes first switch driver 24 driving the first group of N-channel MOSFETs to operate as NC disconnection switch 26, connecting electrical load 56 to third power terminal 18c, which is connected to second busbar 44c which is connected to one end of NC disconnection switch 26, and connecting starter 54 to second power terminal 18b, which is connected to first busbar 44b which is connected to the other end of NC disconnection switch 26. The incorporation of assembly 10 in first electrical supply system 50 further includes mounting an external busbar 58 to connect power terminals 18a and 18b together and connecting battery 52 to the first power terminal 18a.

Figure 4A:
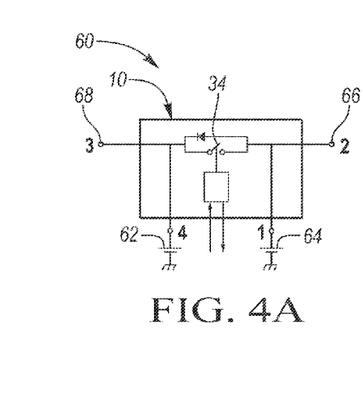
FIG. 4A illustrates an electrical schematic of a second electrical supply system having two batteries and a normally opened ("NO") disconnection switch.

FIG. 4A illustrates an electrical schematic of a second electrical supply system 60 having a main battery 62, and a starter battery 64, and NO disconnection switch 34. Second electrical supply system 60 is for a vehicle having a starter 66 and an electrical load 68. Main battery 62 is to supply DC electrical power to electrical load 68 which may include an alternator. Starter battery 64 is to supply DC electrical power to starter 66. As shown in FIG. 4A, NO disconnection switch 34 is opened.

Figure 4B:
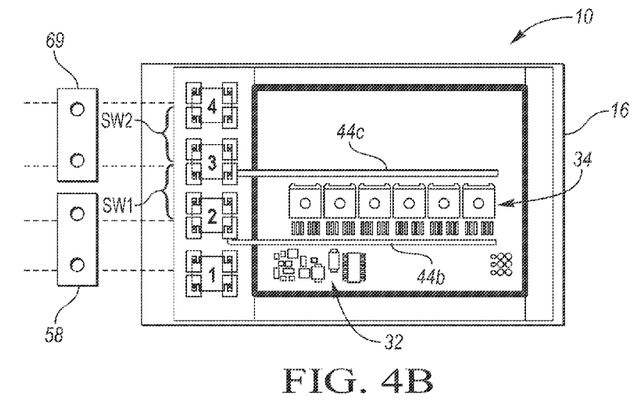
FIG. 4B illustrates a block diagram of the assembly in which the internally configurable dual switch arrangement of the assembly is configured to be the NO disconnection switch in the second electrical supply system.

FIG. 4B illustrates a block diagram of assembly 10 in which internally configurable dual switch arrangement 12 of the assembly is configured as a disconnection system having NO disconnection switch 34 in second electrical supply system 60. In this configuration, first busbar 44b is electrically connected to second power terminal 18b and one end of NO disconnection switch 34 and second busbar 44c is electrically connected to third power terminal 18c and the other end of NO disconnection switch 34.

Incorporating assembly 10 in second electrical supply system 50 for the assembly to provide NO disconnection switch 34 in the second electrical supply system includes second switch driver 32 driving the second group of N-channel MOSFETs to operate as NO disconnection switch 34, connecting electrical load 68 to third power terminal 18c, which is connected to second busbar 44c which is connected to one end of NO disconnection switch 34, and connecting starter 66 to second power terminal 18b, which is connected to first busbar 44b which is connected to the other end of NO disconnection switch 34. The incorporation of assembly 10 in second electrical supply system 60 further includes: mounting external busbar 58 to connect power terminals 18a and 18b together and connecting starter battery 64 to the first power terminal 18a; and mounting a second external busbar 69 to connect power terminals 18c and 18d together and connecting main battery 62 to fourth power terminal 18d.

Figure 5A:
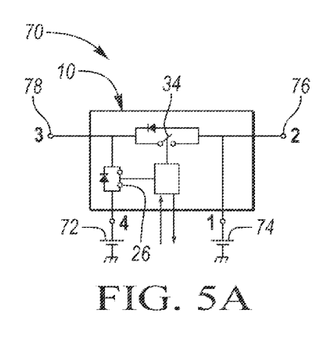
FIG. 5A illustrates an electrical schematic of a third electrical supply system having two batteries, a NO disconnection switch, and a NC disconnection switch.

FIG. 5A illustrates an electrical schematic of a third electrical supply system 70 having a main battery 72, a starter battery 74, a NC disconnection switch 26, and a NO disconnection switch 34. Third electrical supply system 70 is for a vehicle having a starter 76 and an electrical load 78. Main battery 72 is to supply DC electrical power to electrical load 78. Starter battery 74 is to supply DC electrical power to starter 76. As shown in FIG. 5A, NC disconnection switch 26 is closed and NO disconnection switch 34 is opened.

Figure 5B:
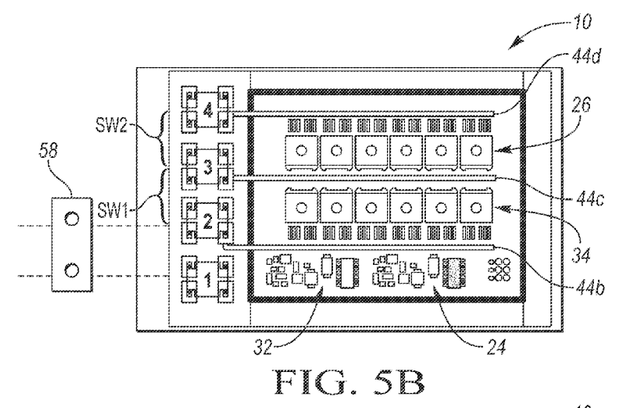
FIG. 5B illustrates a block diagram of the assembly in which the internally configurable dual switch arrangement of the assembly is configured to be the NO disconnection switch and the NC disconnection switch in the third electrical supply system.

FIG. 5B illustrates a block diagram of assembly 10 in which internally configurable dual switch arrangement 12 of the assembly is configured as a disconnection system having NC disconnection switch 26 and NO disconnection switch 34 in third electrical supply system 70. In this configuration, first busbar 44b is electrically connected to second power terminal 18b and one end of NO disconnection switch 34, second busbar 44c is electrically connected to third power terminal 18c and the other end of NO disconnection switch 34 and one end of NC disconnection switch 26, and third busbar 44d is electrically connected to fourth power terminal 18d and the other end of NC disconnection switch 26.

Incorporating assembly 10 in third electrical supply system 70 for the assembly to provide NC disconnection switch 26 and NO disconnection switch 34 in the third electrical supply system includes first switch driver 24 driving the first group of N-channel MOSFETs to operate as NC disconnection switch 26, second switch driver 32 driving the second group of N-channel MOSFETs to operate as NO disconnection switch 34, connecting electrical load 78 to third power terminal 18c, which is connected to second busbar 44c which is connected to one end of NC disconnection switch 26 and one end of NO disconnection switch 34, connecting starter 76 to second power terminal 18b, which is connected to first busbar 44b which is connected to the other end of NO disconnection switch 34, and connecting main battery 72 to fourth power terminal 18d, which is connected to third busbar 44d which is connected to the other end of NC disconnection switch 26. The incorporation of assembly 10 in third electrical supply system 70 includes mounting external busbar 58 to connect power terminals 18a and 18b together and connecting starter battery 76 to the first power terminal 18a. An advantage of using the first group of N-channel MOSFETs to operate as NC disconnection switch 26 is that starter battery 74 can be disconnected from the rest of the network with very fast reaction time.

Different configurations of the electronic module with dual configurable solid-state switches as provided by assembly 10 have been described with reference to FIGS. 3A, 3B, 4A, 4B, 5A, and 5B. As described, with the same PCB 16 and the same power terminals 18a, 18b, 18c, and 18d, it is possible to configure assembly 10 only by mounting the appropriate MOSFETs and the corresponding drivers, the corresponding busbars to connect the power terminals to the PCB (the busbars are screwed to the power terminals and soldered to the PCB), and the corresponding external busbars (if needed) to connect the power terminals (the external busbars being screwed between the power terminals).

By reusing the same PCB and external package, assembly 10 may be used for different electrical supply systems and is much less expensive than using assemblies specifically designed for the different electrical supply systems. That is, implementation of solid-state switches of internally configurable dual switch arrangement 12 of assembly 10 is easily configurable to work in different modes and in different systems.

Figure 6A:
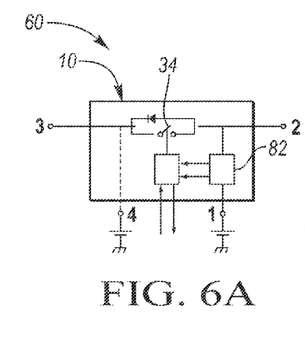
FIG. 6A illustrates an electrical schematic of the second electrical supply system further having a current sensor.
Figure 6B:
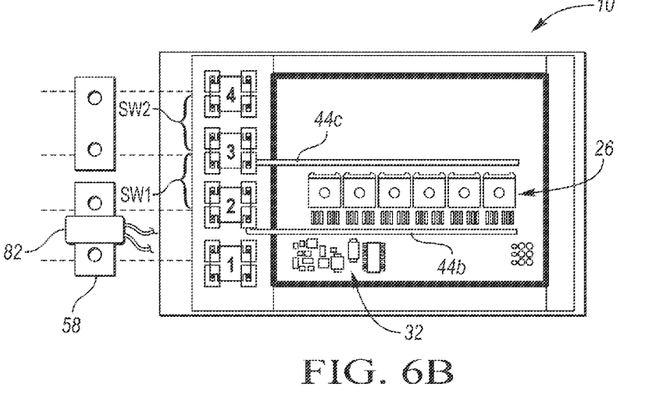
FIG. 6B illustrates a block diagram of the assembly in which the internally configurable dual switch arrangement of the assembly is configured to be the NO disconnection switch in the second electrical supply system and the assembly is further configured to include the current sensor.

Further, the integration of current sensors (either resistive or magnetic) is simple since the sensor may easily be built-in the busbars that connect the power terminals between them. This concept is illustrated with respect to FIGS. 6A and 6B. In particular, FIG. 6A illustrates an electrical schematic of second electrical supply system 60 further having a current sensor 82. FIG. 6B illustrates a block diagram of assembly 10 in which internally configurable dual switch arrangement 12 of the assembly is configured to be NO disconnection switch 34 in second electrical supply system 60 and the assembly is further configured to include current sensor 82. Current sensor 82 is included in assembly 10 by mounting the current sensor to external busbar 58 which is connected between first and second power terminals 18a and 18b.

The solid-state devices of internally configurable dual switch arrangement 12 of assembly 10 described with reference to FIGS. 2, 3B, 4B, 5B, and 6B are N-channel MOSFETs. Accordingly, a first group of N-channel MOSFETs may form NC disconnection switch 26 and a second group of N-channel MOSFETs may form NO disconnection switch 34. As described above, either group of solid-state devices may instead be P-channel MOSFETs. In this case, for instance, a group of P-channel MOSFETs may form NC disconnection switch 26 and a group of N-channel MOSFETs may form NO disconnection switch 34.

Figure 7:
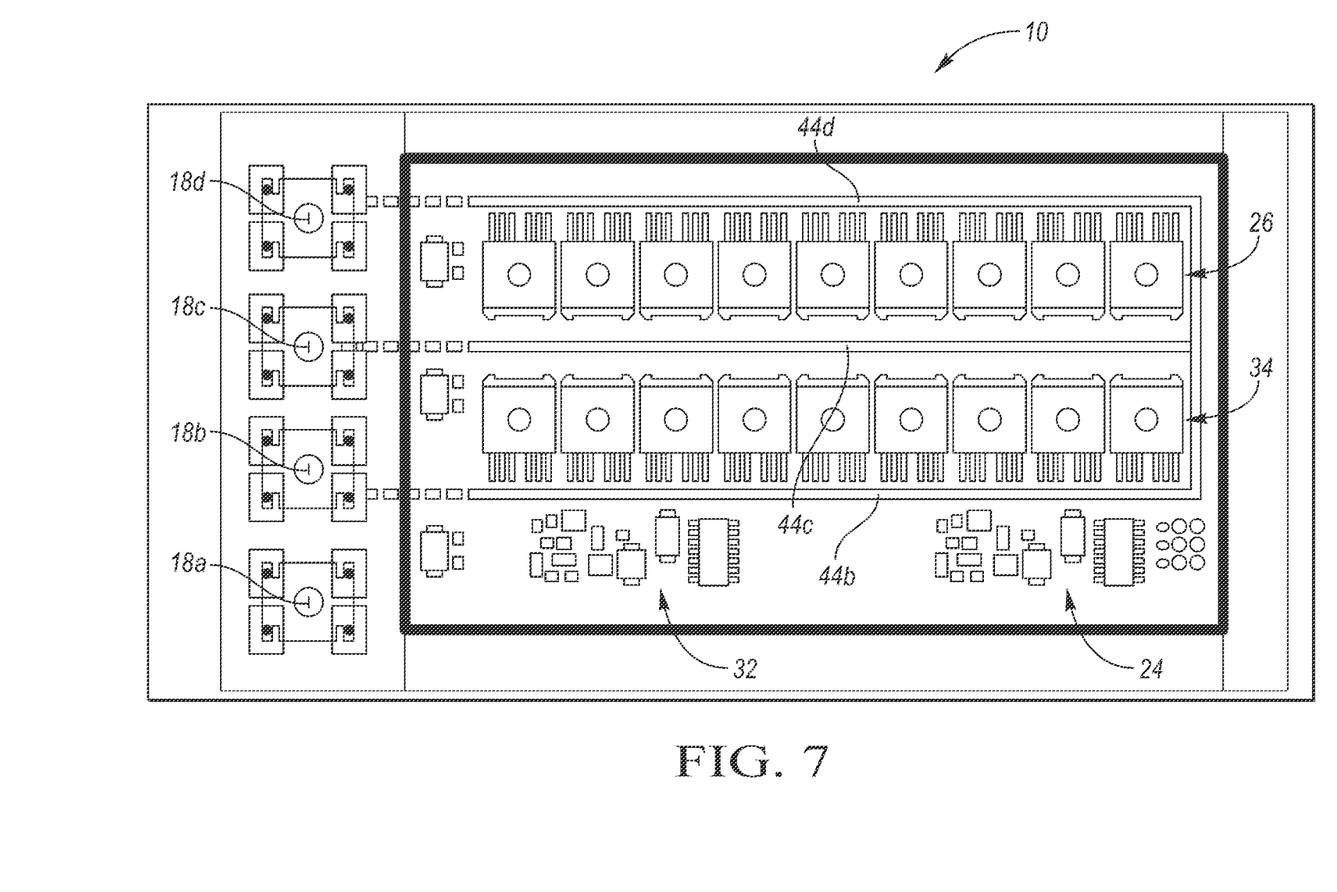
FIG. 7 illustrates a block diagram of a second possible layout of the components of the internally configurable dual switch arrangement of the assembly.

Referring now to FIG. 7, with continual reference to FIG. 2, a block diagram of a second possible layout of the components of internally configurable dual switch arrangement 12 of assembly 10 is shown. A group of P-channel MOSFETs and a group of N-channel MOSFETs are in the second possible layout. When driven by a corresponding first switch driver 24, the P-channel MOSFETs form NC disconnection switch 26. When driven by a corresponding second switch driver 32, the N-channel MOSFETs form NO disconnection switch 34. In the second possible layout, PCB 16 includes first, second, and third busbars 44b, 44c, and 44d (mounted or not depending on the configuration) and power terminals 18a, 18b, 18c, and 18d, which are provided for all component layouts of internally configurable dual switch arrangement 12.

Different configurations of internally configurable dual switch arrangement 12 of assembly 10 having P-channel MOSFETs in place of the first group of N-channel MOSFETs according to the second possible layout corresponds to the different configurations according to the first possible layout shown and described with reference to FIGS. 3A, 3B, 4A, 4B, 5A, 5B, 6A, and 6B. One difference is that in the second possible layout the group of P-channel MOSFETs includes more solid-state devices than the group of N-channel MOSFETs. This is because more P-channel MOSFETs are required to produce the same amount of power as a group N-channel MOSFETs.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. An automotive system comprising:
    an electrical sub-system having a starter battery, a starter, a main battery, and a load;
    an assembly having a printed circuit board including first and second switch areas for first and second groups of solid-state devices to be respectively mounted thereon, first and second driver areas for first and second switch drivers to be respectively mounted thereon, and first, second, and third busbars, the assembly further having an external package including first, second, third, and fourth power terminals;
    wherein the starter battery is connected to the first power terminal, the starter and the first busbar are connected to the second power terminal, the load and the second busbar are connected to the third power terminal, and the main battery and the third busbar are connected to the fourth power terminal;
    wherein the assembly provides the electrical sub-system with one of a first electrical disconnection sub-system including a normally closed (NC) disconnection switch, a second electrical disconnection sub-system including a normally opened (NO) disconnection switch, or a third electrical disconnection sub-system including a NC disconnection switch and a NO disconnection switch connected at a common point;
    wherein when the assembly provides the first electrical disconnection sub-system the first switch area includes the first group of solid-state devices mounted thereon and the first driver area includes the first switch driver mounted thereon, the first switch driver drives the first group of solid-state devices as the NC disconnection switch, and the first busbar connects one end of the NC disconnection switch to the second power terminal and the second busbar connects another end of the NC disconnection switch to the third power terminal whereby the NC disconnection switch is connected between the starter and the load;
    wherein when the assembly provides the second electrical disconnection sub-system the second switch area includes the second group of solid-state devices mounted thereon and the second driver area includes the second switch driver mounted thereon, the second switch driver drives the second group of solid-state devices as the NO disconnection switch, and the first busbar connects one end of the NO disconnection switch to the second power terminal and the second busbar connects another end of the NO disconnection switch to the third power terminal whereby the NO disconnection switch is connected between the starter and the load; and
    wherein when the assembly provides the third electrical disconnection sub-system the first and second switch areas include the first and second groups of solid-state devices respectively mounted thereon, the first and second driver areas include the first and second switch drivers respectively mounted thereon, the first switch driver drives the first group of solid-state devices as the NC disconnection switch and the second switch driver drives the second group of solid-state devices as the NO disconnection switch, the first busbar connects one end of the NO disconnection switch to the second power terminal and the second busbar connects another end of the NO disconnection switch to the third power terminal whereby the NO disconnection switch is connected between the starter and the load, and the second busbar connects one end of the NC disconnection switch to the third power terminal and the third busbar connects another end of the NC disconnection switch to the fourth power terminal whereby the NC disconnection switch and the NO disconnection switch are connected at the common point and the NC disconnection switch is connected between the main battery and the load;
    wherein the assembly provides the first electrical disconnection sub-system, the automotive system further comprising:
        an external busbar mounted between the first power terminal and the second power terminal whereby the starter battery is directly connected to the starter and is connected to the load through the NC disconnection switch.

2. The assembly of claim 1 wherein:
    the solid-state devices of the first group of solid-state devices are N-channel MOSFETs and the solid-state devices of the second group of solid-state devices are N-channel MOSFETs.

3. The assembly of claim 1 wherein:
    the solid-state devices of the first group of solid-state devices are P-channel MOSFETs and solid-state devices of the second group of solid-state devices are N-channel MOSFETs.

4. The automotive system of claim 1 further comprising:
    a current sensor mounted to the external busbar to sense electrical current provided from the starter battery.

5. An automotive system comprising:
    an electrical sub-system having a starter battery, a starter, a main battery, and a load;
    an assembly having a printed circuit board including first and second switch areas for first and second groups of solid-state devices to be respectively mounted thereon, first and second driver areas for first and second switch drivers to be respectively mounted thereon, and first, second, and third busbars, the assembly further having an external package including first, second, third, and fourth power terminals;
    wherein the starter battery is connected to the first power terminal, the starter and the first busbar are connected to the second power terminal, the load and the second busbar are connected to the third power terminal, and the main battery and the third busbar are connected to the fourth power terminal;
    wherein the assembly provides the electrical sub-system with one of a first electrical disconnection sub-system including a normally closed (NC) disconnection switch, a second electrical disconnection sub-system including a normally opened (NO) disconnection switch, or a third electrical disconnection sub-system including a NC disconnection switch and a NO disconnection switch connected at a common point;
    wherein when the assembly provides the first electrical disconnection sub-system the first switch area includes the first group of solid-state devices mounted thereon and the first driver area includes the first switch driver mounted thereon, the first switch driver drives the first group of solid-state devices as the NC disconnection switch, and the first busbar connects one end of the NC disconnection switch to the second power terminal and the second busbar connects another end of the NC disconnection switch to the third power terminal whereby the NC disconnection switch is connected between the starter and the load;

wherein when the assembly provides the second electrical disconnection sub-system the second switch area includes the second group of solid-state devices mounted thereon and the second driver area includes the second switch driver mounted thereon, the second switch driver drives the second group of solid-state devices as the NO disconnection switch, and the first busbar connects one end of the NO disconnection switch to the second power terminal and the second busbar connects another end of the NO disconnection switch to the third power terminal whereby the NO disconnection switch is connected between the starter and the load; and wherein when the assembly provides the third electrical disconnection sub-system the first and second switch areas include the first and second groups of solid-state devices respectively mounted thereon, the first and second driver areas include the first and second switch drivers respectively mounted thereon, the first switch driver drives the first group of solid-state devices as the NC disconnection switch and the second switch driver drives the second group of solid-state devices as the NO disconnection switch, the first busbar connects one end of the NO disconnection switch to the second power terminal and the second busbar connects another end of the NO disconnection switch to the third power terminal whereby the NO disconnection switch is connected between the starter and the load, and the second busbar connects one end of the NC disconnection switch to the third power terminal and the third busbar connects another end of the NC disconnection switch to the fourth power terminal whereby the NC disconnection switch and the NO disconnection switch are connected at the common point and the NC disconnection switch is connected between the main battery and the load;

wherein the assembly provides the second electrical disconnection sub-system, the automotive system further comprising:
  a first external busbar mounted between the first power terminal and the second power terminal whereby the starter battery is directly connected to the starter and is connected to the load through the NO disconnection switch; and
  a second external busbar mounted between the third power terminal and the fourth power terminal whereby the main battery is directly connected to the load.

6. The automotive system of claim 5 further comprising:
a current sensor mounted to the first external busbar to sense electrical current provided from the starter battery.

7. The automotive system of claim 5 further comprising:
a current sensor mounted to the second external busbar to sense electrical current provided from the main battery.

8. An automotive system comprising:
an electrical sub-system having a starter battery, a starter, a main battery, and a load;
an assembly having a printed circuit board including first and second switch areas for first and second groups of solid-state devices to be respectively mounted thereon, first and second driver areas for first and second switch drivers to be respectively mounted thereon, and first, second, and third busbars, the assembly further having an external package including first, second, third, and fourth power terminals;

wherein the starter battery is connected to the first power terminal, the starter and the first busbar are connected to the second power terminal, the load and the second busbar are connected to the third power terminal, and the main battery and the third busbar are connected to the fourth power terminal;

wherein the assembly provides the electrical sub-system with one of a first electrical disconnection sub-system including a normally closed (NC) disconnection switch, a second electrical disconnection sub-system including a normally opened (NO) disconnection switch, or a third electrical disconnection sub-system including a NC disconnection switch and a NO disconnection switch connected at a common point;

wherein when the assembly provides the first electrical disconnection sub-system the first switch area includes the first group of solid-state devices mounted thereon and the first driver area includes the first switch driver mounted thereon, the first switch driver drives the first group of solid-state devices as the NC disconnection switch, and the first busbar connects one end of the NC disconnection switch to the second power terminal and the second busbar connects another end of the NC disconnection switch to the third power terminal whereby the NC disconnection switch is connected between the starter and the load;

wherein when the assembly provides the second electrical disconnection sub-system the second switch area includes the second group of solid-state devices mounted thereon and the second driver area includes the second switch driver mounted thereon, the second switch driver drives the second group of solid-state devices as the NO disconnection switch, and the first busbar connects one end of the NO disconnection switch to the second power terminal and the second busbar connects another end of the NO disconnection switch to the third power terminal whereby the NO disconnection switch is connected between the starter and the load; and wherein when the assembly provides the third electrical disconnection sub-system the first and second switch areas include the first and second groups of solid-state devices respectively mounted thereon, the first and second driver areas include the first and second switch drivers respectively mounted thereon, the first switch driver drives the first group of solid-state devices as the NC disconnection switch and the second switch driver drives the second group of solid-state devices as the NO disconnection switch, the first busbar connects one end of the NO disconnection switch to the second power terminal and the second busbar connects another end of the NO disconnection switch to the third power terminal whereby the NO disconnection switch is connected between the starter and the load, and the second busbar connects one end of the NC disconnection switch to the third power terminal and the third busbar connects another end of the NC disconnection switch to the fourth power terminal whereby the NC disconnection switch and the NO disconnection switch are connected at the common point and the NC disconnection switch is connected between the main battery and the load;

wherein the assembly provides the third electrical disconnection sub-system, the automotive system further comprising:
  an external busbar mounted between the first power terminal and the second power terminal whereby the starter battery is directly connected to the starter and is connected to the load through the NO disconnection switch.

9. The automotive system of claim 8 further comprising:
a current sensor mounted to the external busbar to sense electrical current provided from the starter battery.

* * * * *